(12) United States Patent
Choi et al.

(10) Patent No.: US 12,745,397 B2
(45) Date of Patent: Sep. 22, 2026

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Eun Seok Choi, Icheon-si (KR); Jae Young Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 450 days.

(21) Appl. No.: 18/358,627

(22) Filed: Jul. 25, 2023

(65) Prior Publication Data

US 2024/0334694 A1 Oct. 3, 2024

(30) Foreign Application Priority Data

Mar. 29, 2023 (KR) ........................ 10-2023-0041050

(51) Int. Cl.

| | |
|---|---|
| ***H10B 43/27*** | (2023.01) |
| ***H10B 41/27*** | (2023.01) |
| ***H10B 41/35*** | (2023.01) |
| ***H10B 43/35*** | (2023.01) |
| ***H10B 80/00*** | (2026.01) |

(Continued)

(52) U.S. Cl.

CPC ............. *H10B 43/27* (2023.02); *H10B 41/27* (2023.02); *H10B 41/35* (2023.02); *H10B 43/35* (2023.02); *H10B 80/00* (2023.02); *H10W 90/00* (2026.01); *H10W 80/211* (2026.01); *H10W 80/312* (2026.01); *H10W 80/327* (2026.01); *H10W 90/792* (2026.01)

(58) Field of Classification Search

CPC ........ H10B 43/27; H10B 41/27; H10B 41/35; H10B 43/35; H10B 80/00; H10B 41/50; H10B 41/41; H10B 43/40; H10B 43/50; H01L 24/08; H01L 24/80; H01L 25/0657; H01L 25/18; H01L 25/50; H01L 2224/08145; H01L 2224/80006; H01L 2224/80895; H01L 2224/80896; H01L 2924/1431; H01L 2924/14511; H10W 90/00; H10W 80/211; H10W 80/312; H10W 80/327; H10W 90/792; H10W 72/90; H10W 99/00

See application file for complete search history.

(56) References Cited

U.S. PATENT DOCUMENTS

| | | | | |
|---|---|---|---|---|
| 10,629,616 B1 | 4/2020 | Kai et al. | | |
| 11,758,718 B2 * | 9/2023 | Lien | H10B 41/27 | 365/185.29 |

(Continued)

FOREIGN PATENT DOCUMENTS

| | | |
|---|---|---|
| KR | 1020210092090 A | 7/2021 |

*Primary Examiner* — Thanh T Nguyen

(74) *Attorney, Agent, or Firm* — WILLIAM PARK AND ASSOCIATES LTD.

(57) ABSTRACT

A semiconductor device includes a gate structure including drain select lines and word lines, source patterns, and source select lines located between the gate structure and the source patterns. The semiconductor device also includes a first isolation structure extending between the source patterns and between the source select lines, a second isolation structure extending between the drain select lines, and channel structures extending into the source patterns through the gate structure and the source select lines.

20 Claims, 18 Drawing Sheets

(51) Int. Cl.
*H10W 80/00* (2026.01)
*H10W 90/00* (2026.01)

(56) References Cited

U.S. PATENT DOCUMENTS

2018/0366483 A1* 12/2018 Choi ...................... H10B 41/47
2023/0180480 A1* 6/2023 Chung ................ H01L 25/0657
257/324

* cited by examiner

SEMICONDUCTOR DEVICE AND MANUFACTURING METHOD OF THE SEMICONDUCTOR DEVICE

CROSS-REFERENCE TO RELATED APPLICATION

This application claims priority under 35 U.S.C. § 119(a) to Korean Patent Application No. 10-2023-0041050 filed on Mar. 29, 2023, in the Korean Intellectual Property Office, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, to improve the operational reliability of such a semiconductor device, various structures and manufacturing methods have been developed.

SUMMARY

In an embodiment, a semiconductor device may include: a gate structure including drain select lines and word lines; source patterns; source select lines located between the gate structure and the source patterns; a first isolation structure extending between the source patterns and between the source select lines; a second isolation structure extending between the drain select lines; and channel structures extending into the source patterns through the gate structure and the source select lines.

In an embodiment, a semiconductor device may include: drain select lines; word lines stacked on the drain select lines; source patterns located on the word lines and each including first sidewalls; source select lines located between the word lines and the source patterns and each including second sidewalls aligned with the first sidewalls; and channel structures extending into the source patterns through the drain select lines, the word lines, and the source select lines.

In an embodiment, a manufacturing method of a semiconductor device may include: forming a source select layer on a substrate; forming a gate structure including word lines and drain select lines on the source select layer; at least partially removing the substrate so that the source select layer is exposed; forming a source layer on the source select layer; etching the source layer to form source patterns; and etching the source select layer to form source select lines respectively located below the source patterns.

In an embodiment, a manufacturing method of a semiconductor device may include: forming a first wafer including a substrate, a source select layer, word lines, and drain select lines; forming a second wafer including a peripheral circuit; bonding the first wafer and the second wafer to each other; at least partially removing the substrate so that the source select layer is exposed; forming a source layer on the source select layer; etching the source layer to form source patterns; and etching the source select layer to form source select lines respectively located below the source patterns.

DETAILED DESCRIPTION

Various embodiments are directed to a semiconductor device having a stable structure and improved characteristics and a manufacturing method of the semiconductor device.

By stacking memory cells in three dimensions, it is possible to improve the degree of integration of a semiconductor device. According to the present technology, it is possible to provide a semiconductor device having a stable structure and improved reliability.

Hereafter, embodiments in accordance with the technical spirit of the present disclosure will be described with reference to the accompanying drawings.

Figure 1A:
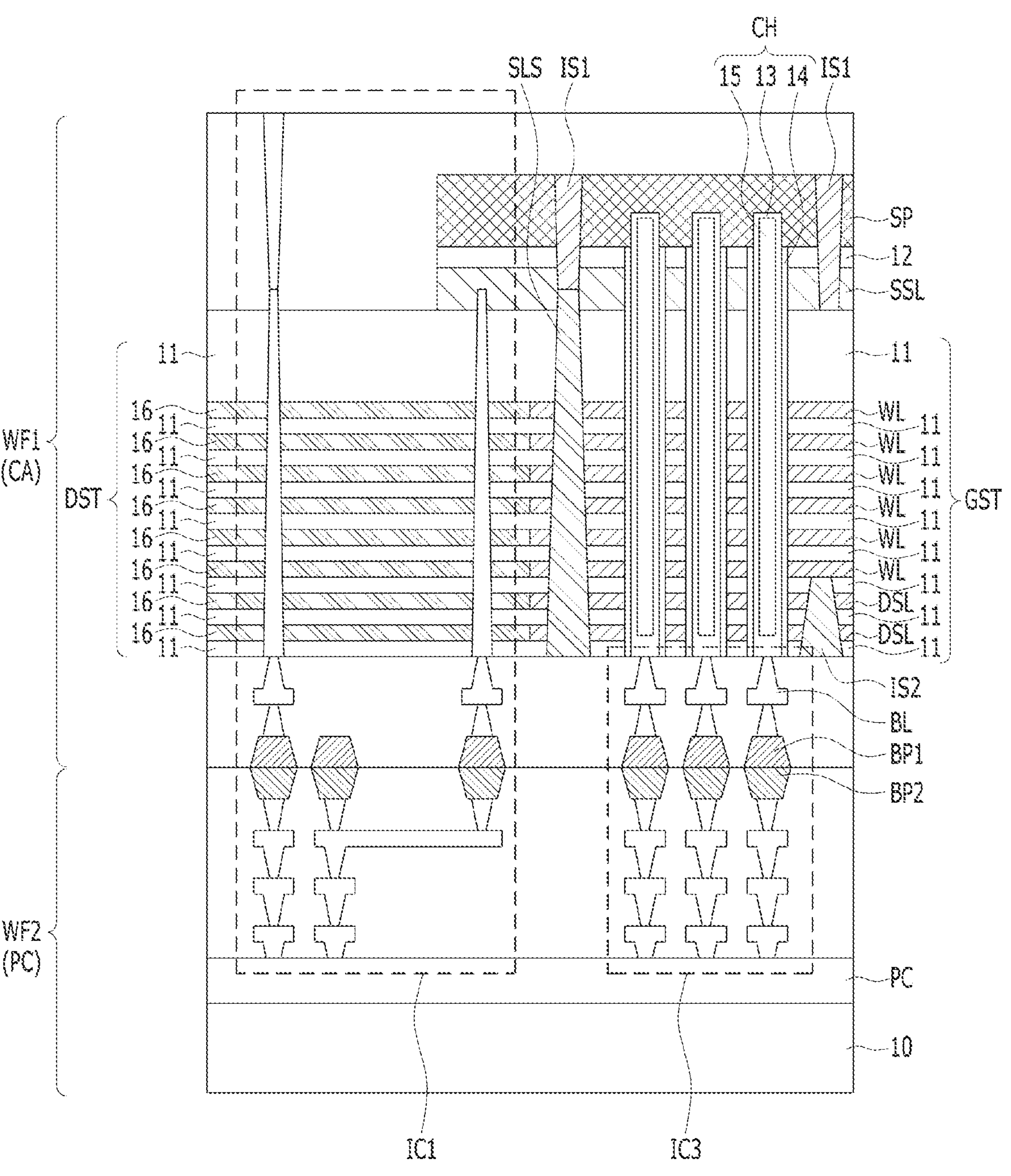
FIGS. 1A and 1B are diagrams illustrating the structure of a semiconductor device in accordance with an embodiment.
Figure 1B:
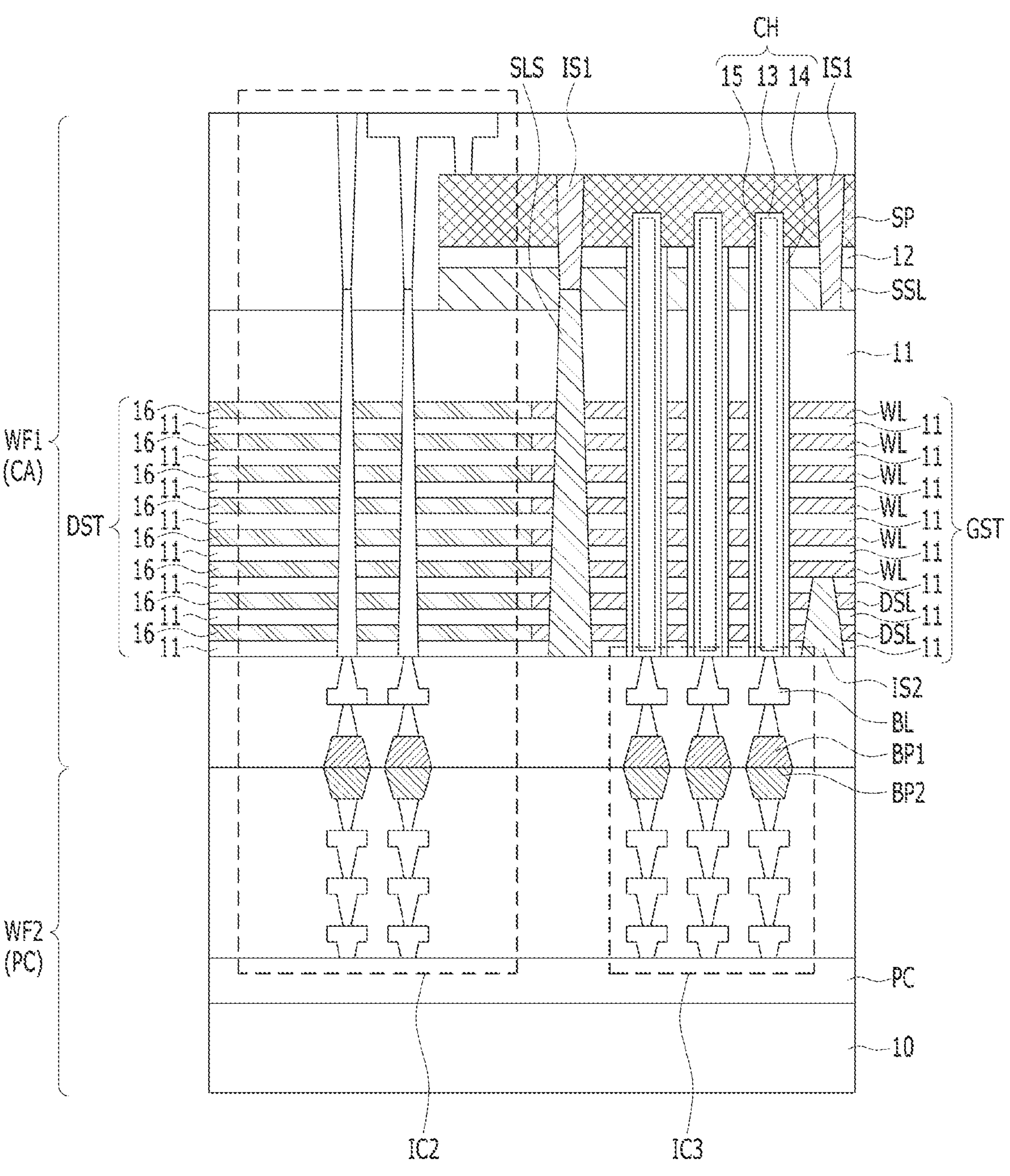

FIGS. 1A and 1B are diagrams illustrating the structure of a semiconductor device in accordance with an embodiment.

Referring to FIGS. 1A and 1B, the semiconductor device may include a first wafer WF1 and a second wafer WF2, and may have a structure in which the first wafer WF1 and the second wafer WF2 are bonded to each other. The first wafer WF1 may include a cell array CA, and the second wafer WF2 may include a peripheral circuit PC. The cell array CA may include stacked memory cells. The peripheral circuit PC may include a circuit for driving the cell array CA. As an example, the peripheral circuit PC may include a page buffer, a row-decoder, and the like.

For reference, at least one of the first wafer WF1 and the second wafer WF2 might not include a substrate. As an example, after bonding the first wafer WF1 and the second wafer WF2, a substrate of the first wafer WF1 may be removed. The substrate may be completely removed or a partially removed from the first wafer WF1.

A substrate of at least one of the first wafer WF1 and the second wafer WF2 may be formed after the bonding of the first wafer WF1 and the second wafer WF2. As an example, a source structure, a metal layer, etc. may serve as the substrate.

The semiconductor device may include a gate structure GST, source patterns SP, and source select lines SSL. The semiconductor device may further include a dummy structure DST, an insulating layer 12, a first isolation structure IS1, a second isolation structure IS2, a slit structure SLS, channel structures CH, a substrate 10, the peripheral circuit PC, bit lines BL, a first interconnection structure IC1, a second interconnection structure IC2, or a third interconnection structure IC3, or a combination thereof.

The gate structure GST may include gate lines and insulating layers 11 that are alternately stacked. The gate lines may include word lines WL and drain select lines DSL. The gate lines may each include a conductive material such as polysilicon, tungsten (W), or molybdenum (Mo). The insulating layers 11 may each include an insulating material such as oxide, nitride, or air gap. The gate structure GST may be located between the source select lines SSL and the bit lines BL.

The dummy structure DST may include sacrificial layers 16 and the insulating layers 11 that are alternately stacked. The sacrificial layers 16 may remain without being replaced with gate lines in a manufacturing process. The sacrificial layers 16 may each include a material having a high etching selectivity with respect to the insulating layers 11. As an example, the sacrificial layers 16 may each include nitride and the insulating layers 11 may each include oxide. The insulating layers 11 of the gate structure GST and the insulating layers 11 of the dummy structure DST may be connected to each other.

The source patterns SP may be located on the gate structure GST and may extend above the dummy structure DST. The source patterns SP may each include a conductive material such as polysilicon, tungsten (W), or molybdenum (Mo).

The source select lines SSL may be located between the source patterns SP and the gate structure GST. The source select lines SSL may be located below the source patterns SP, respectively. The source select lines SSL and the source patterns SP may be located or grouped in a one-to-one manner. The source select lines SSL may each have a shape corresponding to the source patterns SP. As an example, the source select lines SSL may be patterned together with the source patterns SP, and may each have substantially the same width as the source patterns SP.

The source select lines SSL may each include a conductive material such as polysilicon, tungsten (W), or molybdenum (Mo). As an example, the source select lines SSL may each include the same material as the source patterns SP, and may each include polysilicon. As an example, the source select lines SSL may each include a material different from that of the source patterns SP and may each include metal, and the source patterns SP may each include polysilicon. FIGS. 1A and 1B illustrate that the source select lines SSL are arranged in a single layer; however, the source select lines SSL may be stacked in multiple layers.

The insulating layer 12 may be located between the source patterns SP and the source select lines SSL. The source patterns SP and the source select lines SSL may be insulated from each other by the insulating layer 12. The insulating layer 12 may include an insulating material such as oxide or nitride.

The channel structures CH may be located in the gate structure GST. The channel structures CH may extend into the source patterns SP through the gate structure GST and the source select lines SSL. The channel structure CH may include a channel layer 13. The channel structure CH may further include a memory layer 14 surrounding the channel layer 13 or an insulating core 15 within the channel layer 13, or a combination thereof.

The memory layer 14 may include a floating gate, polysilicon, a charge trap material, nitride, a variable resistance material, or the like. The memory layer 14 may be located between the channel layer 13 and the gate structure GST and between the channel layer 13 and the source select line SSL. An end of the channel layer 13 might not be surrounded by the memory layer 14. The end of the channel layer 13 may be located in the source pattern SP and may be connected to the source pattern SP.

The channel structures CH may be connected between the source patterns SP and the bit lines BL. Memory cells may be located in regions where the channel structures CH and the word lines WL intersect with each other. Source select transistors may be located in regions where the channel structures CH and the source select lines SSL intersect with each other. Drain select transistors may be located in regions where the channel structures CH and the drain select lines DSL intersect with each other. At least one source select transistor, a plurality of memory cells, and at least one drain select transistor sharing the channel structure CH may constitute one memory string.

The first isolation structure IS1 may extend between the source patterns SP and between the source select lines SSL. The source patterns SP located on the same level may be separated from each other by the first isolation structure IS1. The source select lines SSL located on the same level may be separated from each other by the first isolation structure IS1.

As an example, the first isolation structure IS1 may be located at a boundary between memory blocks. The memory block may be a unit of an erase operation. The source patterns SP and the source select lines SSL may be separated in units of memory blocks by the first isolation structure IS1. The source patterns SP and the source select lines SSL may be driven in units of memory blocks.

As an example, the first isolation structure IS1 may be located within the memory block. A sub-memory block may be a smaller unit than the memory block. One memory block may include a plurality of sub-memory blocks. The source patterns SP and the source select lines SSL may be separated in units of sub-memory blocks by the first isolation structure IS1. Through this, a plurality of source patterns SP and a plurality of source select lines SSL may be included in one memory block. The source patterns SP and the source select lines SSL may be driven in units of sub-memory blocks.

The first isolation structure IS1 may have a uniform width or may have different widths according to levels. The first isolation structure IS1 may have a tapered shape, and a portion of the first isolation structure IS1 overlapping the source select line SSL may have a narrower width than a portion of the first isolation structure IS1 overlapping the source pattern SP. As an example, the first isolation structure IS1 may have a tapered shape in which a lower portion thereof has a narrower width than an upper portion thereof.

The second isolation structure IS2 may be located in the gate structure GST. The second isolation structure IS2 may extend between the drain select lines DSL. The drain select lines DSL located at the same level may be separated from each other by the second isolation structure IS2. The second isolation structure IS2 may be located at the boundary between the memory blocks or within the memory block. The second isolation structure IS2 may be located in correspondence with the first isolation structure IS1. As an example, the first isolation structure IS1 may be located above the second isolation structure IS2, and the first isolation structure IS1 and the second isolation structure IS2 may be located to face each other with the word lines WL interposed therebetween.

The second isolation structure IS2 may have a uniform width or may have different widths according to levels. The second isolation structure IS2 may have a tapered shape, and a portion of the second isolation structure IS2 adjacent to the word line WL may have a narrower width than a portion of the second isolation structure IS2 adjacent to the bit line BL. As an example, the second isolation structure IS2 may have a tapered shape in which an upper portion thereof has a narrower width than a lower portion thereof. The first isolation structure IS1 and the second isolation structure IS2 may have tapered shapes in opposite directions.

The slit structure SLS may extend through the gate structure GST. The slit structure SLS may be located at a boundary between the memory blocks. The gate structure GST may be separated in units of memory blocks by the slit structure SLS. The slit structure SLS may extend into the source select line SSL. The slit structure SLS may be located in correspondence with the first isolation structure IS1, and may be connected to the first isolation structure IS1. As an example, the first isolation structure IS1 may be located above the slit structure SLS, and a lower surface of the first isolation structure IS1 may come into contact with an upper surface of the slit structure SLS.

The slit structure SLS may have a uniform width or may have different widths according to levels. The slit structure SLS may have a tapered shape, and a portion of the slit structure SLS adjacent to the source select line SSL may have a narrower width than a portion of the slit structure SLS adjacent to the word line WL. As an example, the slit structure SLS may have a tapered shape in which an upper portion thereof has a narrower width than a lower portion thereof. The first isolation structure IS1 and the slit structure SLS may have tapered shapes in opposite directions.

The peripheral circuit PC may be located on the substrate 10. The cell array CA of the first wafer WF1 and the peripheral circuit PC of the second wafer WF2 may be electrically connected to each other through the interconnection structure. The interconnection structure may include the first interconnection structure IC1, the second interconnection structure IC2, or the third interconnection structure IC3, or a combination thereof.

Referring to FIG. 1A, the first interconnection structure IC1 may extend through the dummy structure DST, and electrically connect the peripheral circuit PC and the source select lines SSL to each other. The first interconnection structure IC1 may include a contact plug, a wiring line, a bonding pad, and the like. By bonding the first bonding pad BP1 of the first wafer WF1 to the second bonding pad BP2 of the second wafer WF2, the source select lines SSL of the first wafer WF1 and the peripheral circuit PC of the second wafer WF2 may be electrically connected to each other.

Referring to FIG. 1B, the second interconnection structure IC2 may extend through the dummy structure DST, and electrically connect the peripheral circuit PC and the source patterns SP to each other. The second interconnection structure IC2 may include a contact plug, a wiring line, a bonding pad, and the like. By bonding the first bonding pad BP1 of the first wafer WF1 to the second bonding pad BP2 of the second wafer WF2, the source patterns SP of the first wafer WF1 and the peripheral circuit PC of the second wafer WF2 may be electrically connected to each other.

Referring to FIGS. 1A and 1B, the third interconnection structure IC3 may include the bit lines BL connected to the channel structures CH, and electrically connect the bit lines BL and the peripheral circuit PC to each other. The third interconnection structure IC3 may include a contact plug, a wiring line, a bonding pad, and the like. By bonding the first bonding pad BP1 of the first wafer WF1 to the second bonding pad BP2 of the second wafer WF2, the bit lines BL of the first wafer WF1 and the peripheral circuit PC of the second wafer WF2 may be electrically connected to each other. The source patterns SP and the source select lines SSL may serve as the substrate of the first wafer WF1.

According to the structure described above, the source patterns SP can be separated from each other by the first isolation structure IS1, and the source select lines SSL can be separated from each other by the first isolation structure IS1. The first isolation structure IS1 can be located at a boundary between memory blocks, and can drive the source pattern SP and the source select line SSL in units of memory blocks. The first isolation structure IS1 may be located within the memory block, and can drive the source pattern SP and the source select line SSL in units of sub-memory blocks. Through this, biases of the source pattern SP and the source select line SSL can be controlled in units of memory blocks or in units of sub-memory blocks, and operating characteristics of a source select transistor can be improved. It is also possible to improve disturbance of a program operation and a read operation.

Figure 2:
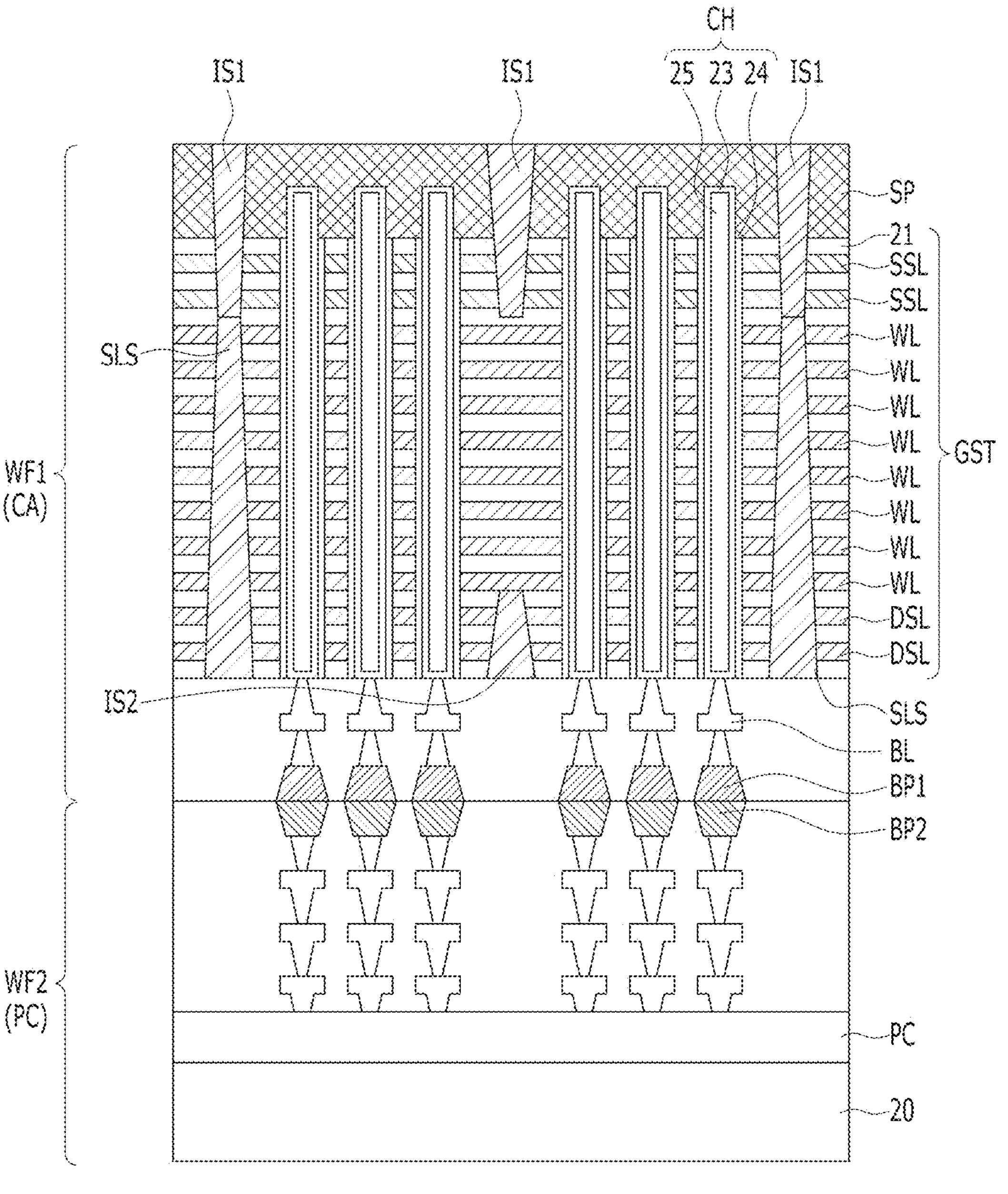
FIG. 2 is a diagram illustrating the structure of a semiconductor device in accordance with an embodiment.

FIG. 2 is a diagram illustrating the structure of a semiconductor device in accordance with an embodiment. Hereinafter, content previously described is not repeated.

Referring to FIG. 2, the semiconductor device may include a first wafer WF1 and a second wafer WF2, and may have a structure in which the first wafer WF1 and the second wafer WF2 are bonded to each other. The first wafer WF1 may include a cell array CA, and the second wafer WF2 may include a peripheral circuit PC.

The semiconductor device may include a gate structure GST, source patterns SP, a first isolation structure IS1, a second isolation structure IS2, a slit structure SLS, channel structures CH, a substrate 20, the peripheral circuit PC, or bit lines BL, or a combination thereof.

The gate structure GST may include gate lines and insulating layers 21 that are alternately stacked. The gate lines may include word lines WL, drain select lines DSL, and source select lines SSL. The gate structure GST may be located between the source patterns SP and the bit lines BL. The source patterns SP may be located on the gate structure GST.

The source select lines SSL may be located below the source patterns SP, respectively. As an example, the source select lines SSL may each include the same material as or a different material from the source patterns SP. As an example, the source patterns SP may each include polysilicon, and the source select lines SSL may each include metal.

The channel structures CH may be located in the gate structure GST. The channel structures CH may extend into the source patterns SP through the drain select lines DSL, the word lines WL, and the source select lines SSL. The channel structure CH may include a channel layer 23. The channel structure CH may further include a memory layer 24 surrounding the channel layer 23 and an insulating core 25 within the channel layer 23.

The first isolation structure IS1 may be located in the gate structure GST. The first isolation structure IS1 may extend between the source patterns SP and between the source select lines SSL. The source patterns SP located on the same level may be separated from each other by the first isolation structure IS1. The source select lines SSL located on the same level may be separated from each other by the first isolation structure IS1. The first isolation structure IS1 may be located at a boundary between memory blocks or within the memory block.

The second isolation structure IS2 may be located in the gate structure GST. The second isolation structure IS2 may extend between the drain select lines DSL. The drain select lines DSL located on the same level may be separated from each other by the second isolation structure IS2. The second isolation structure IS2 may be located at the boundary between the memory blocks or within the memory block. The second isolation structure IS2 may be located in correspondence with the first isolation structure IS1.

The slit structure SLS may extend through the gate structure GST. The slit structure SLS may be located at the boundary between the memory blocks. The gate structure GST may be separated in units of memory blocks by the slit structure SLS.

The peripheral circuit PC may be located on the substrate 10. The cell array CA of the first wafer WF1 and the peripheral circuit PC of the second wafer WF2 may be electrically connected to each other through the interconnection structure. The third interconnection structure IC3 may include the bit lines BL, and may electrically connect the bit lines BL and the peripheral circuit PC to each other. The source patterns SP may serve as the substrate of the first wafer WF1.

According to the structure described above, the source select lines SSL can be located in the gate structure GST. The source patterns SP can be separated from each other by the first isolation structure IS1. Furthermore, the first isolation structure IS1 can extend into the gate structure GST and separate the source select lines SSL from each other.

Figure 3:
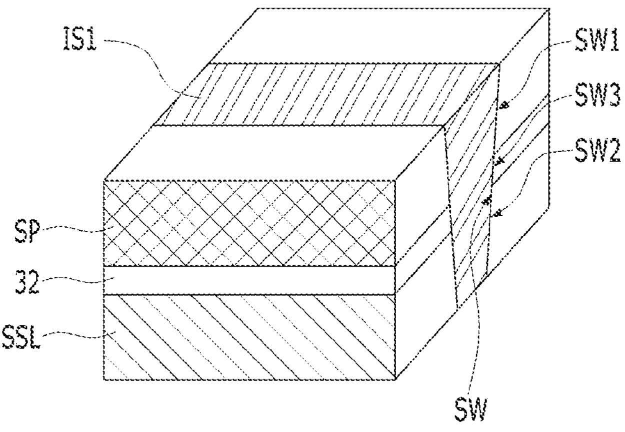
FIG. 3 is a perspective view illustrating the structure of a semiconductor device in accordance with an embodiment.

FIG. 3 is a perspective view illustrating the structure of a semiconductor device in accordance with an embodiment. Hereinafter, content previously described is not repeated.

Referring to FIG. 3, a source pattern SP may include a first sidewall SW1, a source select line SSL may include a second sidewall SW2, and an insulating layer 32 may include a third sidewall SW3. The first sidewall SW1, the second sidewall SW2, and the third sidewall SW3 may contact a sidewall SW of a first isolation structure IS1.

The first sidewall SW1, the second sidewall SW2, and the third sidewall SW3 may be etched surfaces defined by an etching process for forming the first isolation structure IS1. The etched surface may have a vertical profile or an inclined profile. The second sidewall SW2 may be aligned with the first sidewall SW1. The first sidewall SW1 and the second sidewall SW2 may have substantially the same slope. The third sidewall SW3 may be aligned with the first sidewall SW1 and/or the second sidewall SW2. The third sidewall SW3 may have substantially the same slope as the first sidewall SW1 and/or the second sidewall SW2.

Figure 4A:
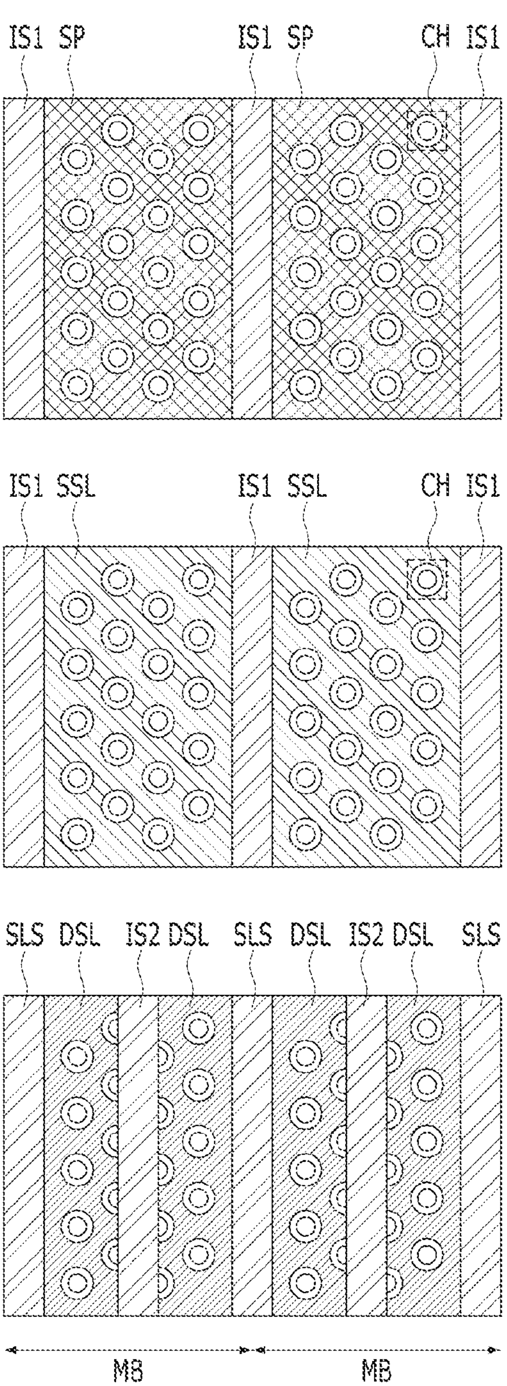
FIGS. 4A and 4B are diagrams illustrating the structure of a semiconductor device in accordance with an embodiment.
Figure 4B:
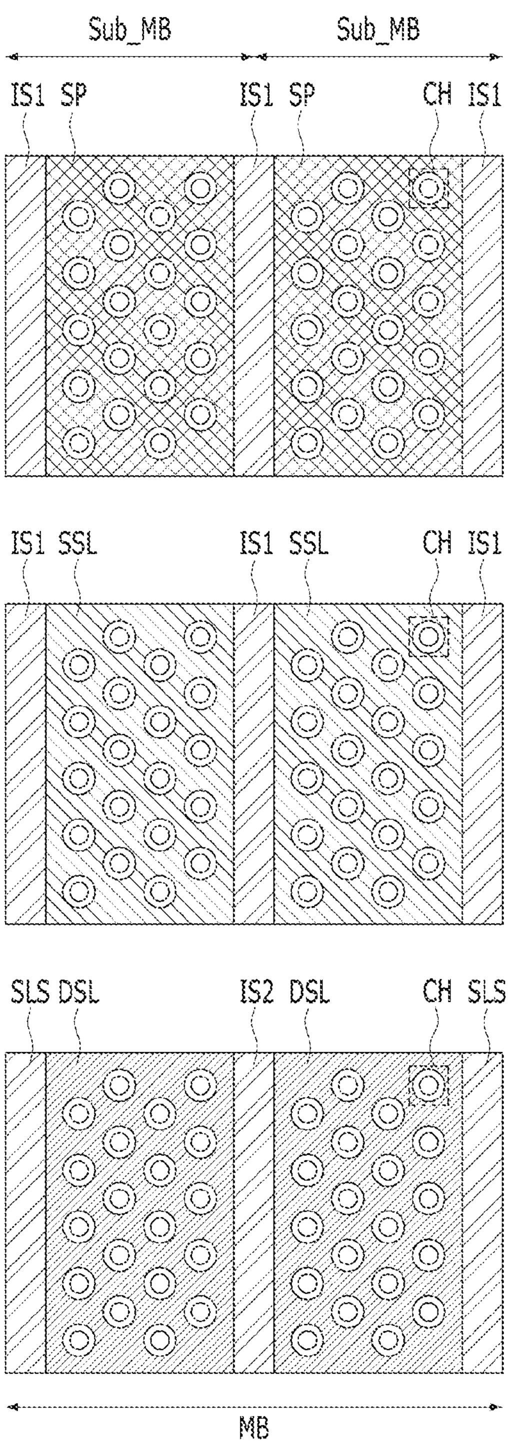

FIGS. 4A and 4B are diagrams illustrating the structure of a semiconductor device in accordance with an embodiment. Hereinafter, descriptions may be made without repeating content already described above.

Referring to FIGS. 4A and 4B, the semiconductor device may include source patterns SP, source select lines SSL, drain select lines DSL, first isolation structures IS1, second isolation structures IS2, and a slit structure SLS.

Referring to FIG. 4A, the slit structure SLS may be located at a boundary between memory blocks MB. The second isolation structures IS2 may be located within the memory block MB. The first isolation structure IS1 may be located at the boundary between the memory blocks MB. Accordingly, the source patterns SP may be separated in units of memory blocks MB, and may be driven in units of memory blocks MB. The source select lines SSL may be separated in units of memory blocks MB, and may be driven in units of memory blocks MB.

Referring to FIG. 4B, each memory block MB may include a plurality of sub-memory blocks Sub MB. The slit structure SLS may be located at the boundary between the memory blocks MB. The second isolation structures IS2 may be located within the memory block MB. The first isolation structures IS1 may be located at the boundary between the memory blocks MB and within the memory blocks MB. Accordingly, the source patterns SP may be separated in units of sub-memory blocks Sub MB, and may be driven in units of sub-memory blocks Sub MB. The source select lines SSL may be separated in units of sub-memory blocks Sub MB, and may be driven in units of sub-memory blocks Sub MB.

According to the structure described above, the first isolation structures IS1 can be located in correspondence with the slit structures SLS, or can be located in correspondence with the slit structures SLS and the second isolation structure IS2. Accordingly, the source patterns SP and the source select lines SSL can be driven in units of memory blocks MB or in units of sub-memory blocks Sub MB.

FIGS. 5A to 5I are diagrams for describing a manufacturing method of a semiconductor device in accordance with an embodiment. Hereinafter, descriptions may be made without repeating content already described above.

Figure 5A:
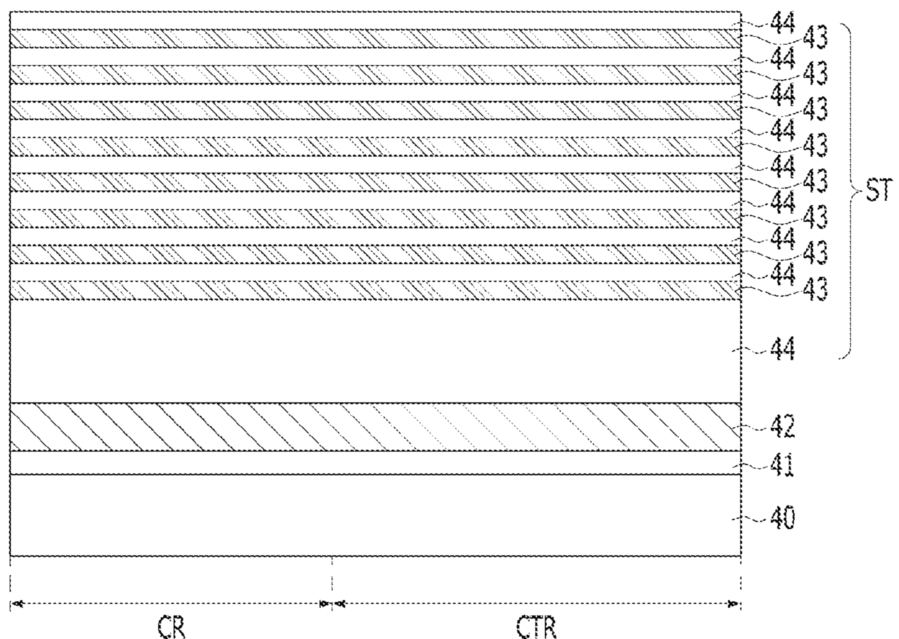
FIGS. 5A to 5I are diagrams for describing a manufacturing method of a semiconductor device in accordance with an embodiment.

Referring to FIG. 5A, an insulating layer 41 may be formed on a substrate 40. The insulating layer 41 may include an insulating material such as oxide or nitride. A source select layer 42 may be formed on the substrate 40. The source select layer 42 may be located on the insulating layer 41, and the substrate 40 and the source select layer 42 may be insulated from each other by the insulating layer 41. The source select layer 42 may be used to form a source select line. The source select layer 42 may include a conductive material such as polysilicon, tungsten (W), or molybdenum (Mo). FIG. 5A illustrates that the source select layer 42 is a single layer; however, the source select layer 42 may be stacked in multiple layers.

Subsequently, a stack ST may be formed on the source select layer 42. The stack ST may include first material layers 43 and second material layers 44 that are alternately stacked. The first material layers 43 may be used to form gate lines, and the second material layers 44 may be used to form insulating layers. As an example, the first material layers 43 may each include a sacrificial material such as nitride, and the second material layers 44 may each include an insulating material such as oxide. As an example, the first material layers 43 may each include a conductive material such as polysilicon or metal, and the second material layers 44 may each include an insulating material such as an oxide.

The first material layers 43 and the second material layers 44 may have substantially the same thickness or different thicknesses. As an example, the lowermost second material layer 44 among the second material layers 44 may have a thicker thickness than the other second material layers 44. Through this, it is possible to prevent or reduce damage to the first material layers 43 when the source select layer 42 is patterned in a subsequent process.

The stack ST may include a cell region CR and a contact region CTR. The cell region CR may be a region where memory cells are to be stacked and a memory string is to be located. The contact region CTR may be a region where an interconnection structure is to be located. A bias may be transferred through the interconnection structure to drive the memory string.

Figure 5B:
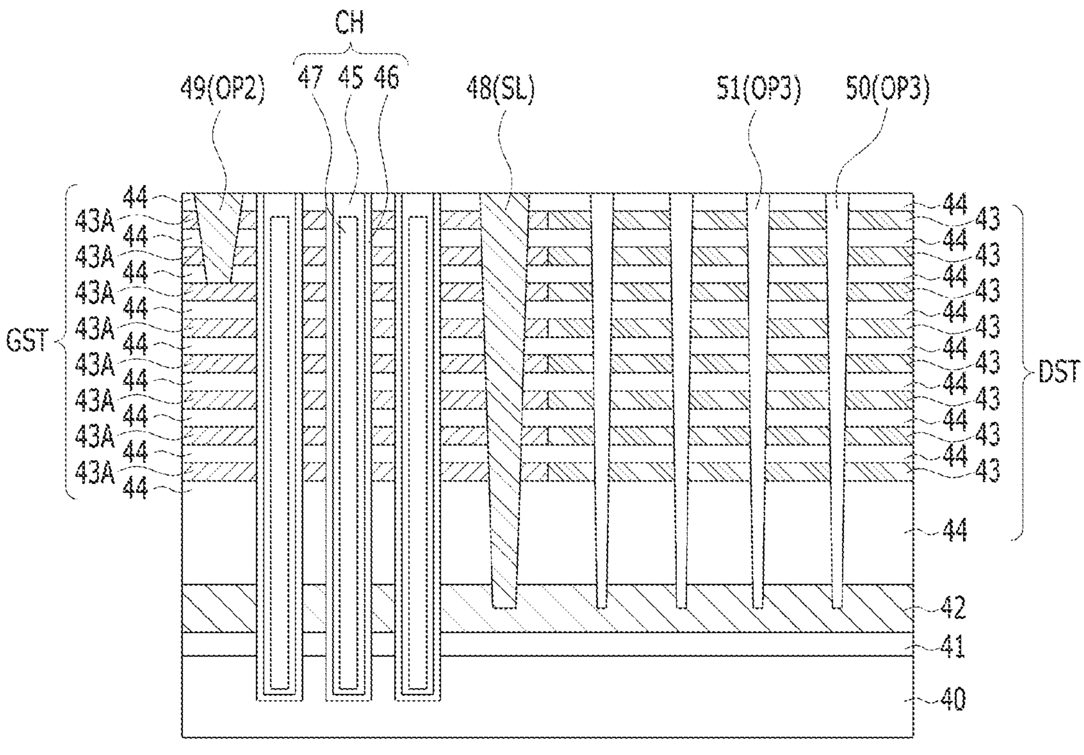

Referring to FIG. 5B, channel structures CH may be formed in the stack ST. The channel structures CH may be located in the cell region CR of the stack ST. The channel structures CH may extend through the stack ST and the source select layer 42. The channel structures CH may extend into the substrate 40 through the insulating layer 41. As an example, first openings OP1 may be formed in the stack ST, and a memory layer 46, a channel layer 45, and an insulating core 47 may be formed in the first openings OP1. The memory layer 46 may include a blocking layer, a data storage layer, and a tunneling layer, or a combination thereof. The data storage layer may include a floating gate, polysilicon, a charge trap material, nitride, a variable resistance material, or the like. Electrode structures may be formed instead of the channel structures CH. The electrode structures may each include a vertical electrode layer instead of the channel layer 45.

Subsequently, a slit SL may be formed in the stack ST. The slit SL may extend through the stack ST. The slit SL may expose the source select layer 42 or may extend into the source select layer 42. The slit SL may also extend to the insulating layer 41 or the substrate 40. The slit SL may be located at a boundary between memory blocks, and the stack ST may be separated in units of memory blocks by the slit SL.

When the first openings OP1 are formed, the slits SL may be formed together. In such a case, a sacrificial layer may be formed in the slit SL, and the channel structure CH may be formed in the first openings OP1. Subsequently, the slit SL may be reopened by removing the sacrificial layer.

Subsequently, the first material layers 43 may be replaced with third material layers 43A through the slit SL. As an example, conductive layers may be formed after the first material layers 43 are removed through the slits SL. Through this, a gate structure GST including the second material layers 44 and third material layers 43A that are alternately stacked may be formed. The third material layers 43A may be gate lines. As an example, the third material layers 43A may be word lines or drain select layers. As an example, at least one uppermost third material layer 43A may be a drain select layer, and the other third material layers 43A may be word lines.

Some of the first material layers 43 may remain without being replaced with the third material layers 43A. The first material layers 43 may remain on at least a part of the contact region CTR. A dummy structure DST may be defined by the remaining first material layers 43. The dummy structure DST may be located in the contact region CTR. The dummy structure DST may include the first material layers 43 and the second material layers 44 that are alternately stacked. The second material layers 44 of the gate structure GST and the second material layers 44 of the dummy structure DST may be connected to each other.

When the first material layers 43 each include a conductive material, the first material layers 43 may also be used as gate lines. In such a case, the gate structure GST may include the first material layers 43 and the second material layers 44 that are alternately stacked. As an example, when the first material layers 43 each include polysilicon, a silicidation process or the like may be performed to reduce the specific resistance of the first material layers 43.

Subsequently, a slit structure 48 may be formed in the slit SL. The slit structure 48 may extend into the source select layer 42 through the gate structure GST. The slit structure 48 may include an insulating material such as oxide, nitride, or air gap. The slit structure 48 may also include a source contact structure and an insulating spacer surrounding sidewalls of the source contact structure.

Subsequently, a second isolation structure 49 may be formed. As an example, after a second opening OP2 is formed in the gate structure GST, the second isolation structure 49 may be formed in the second opening OP2. The drain select layer may be separated into drain select lines by the second isolation structure 49. The second isolation structure 49 may extend between the drain select lines. The second isolation structure 49 may be located at the boundary between the memory blocks or within the memory block. The second isolation structure 49 may include an insulating material such as oxide, nitride, or air gap. The second isolation structure 49 may have a shallower depth than the slit structure 48. The formation order of the second isolation structure 49 and the slit structure 48 may be changed. After the second isolation structure 49 is formed, the slit structure 48 may be formed.

Subsequently, first contact plugs 50 and second contact plugs 51 may be formed in the dummy structure DST. The first contact plugs 50 and the second contact plugs 51 may be located in the contact region CTR. As an example, third openings OP3 may be formed in the dummy structure DST, and conductive layers may be formed in the third openings OP3, respectively. The first contact plugs 50 and the second contact plugs 51 may be used to form an interconnection structure electrically connecting a first wafer and a second wafer to each other. The first contact plugs 50 and the second contact plugs 51 may extend into the source select layer 42 through the dummy structure DST.

When the first openings OP1 or the slits SL are formed, the third openings OP3 may be formed together. In such a case, a sacrificial layer may be formed in the third openings OP3, and the channel structure CH may be formed in the first openings OP1 or the slit structure 48 may be formed in the slits SL. Subsequently, the third openings OP3 may be reopened by removing the sacrificial layer.

Figure 5C:
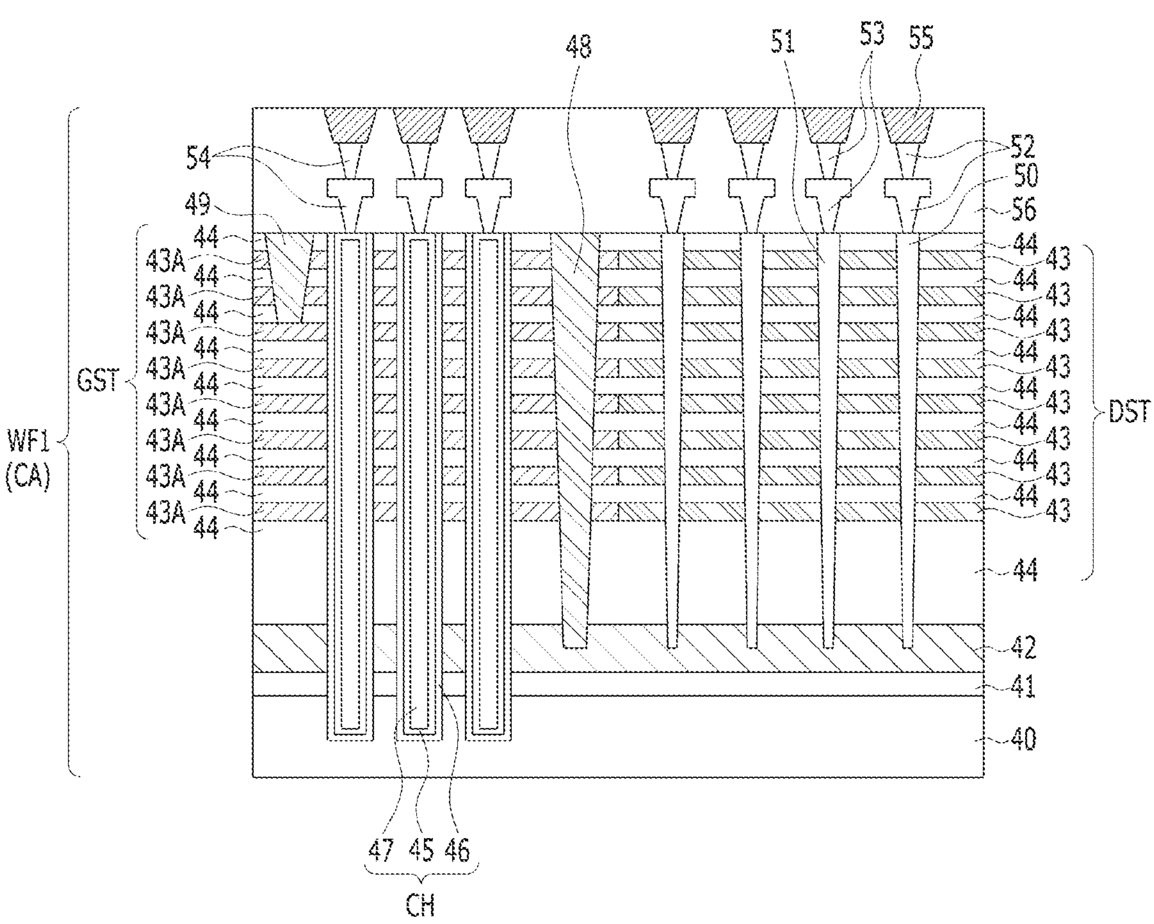

Referring to FIG. 5C, interconnection structures 52 to 54 and a first interlayer dielectric layer 56 may be formed. The interconnection structures 52 to 54 may be located in the first interlayer dielectric layer 56, and the first interlayer dielectric layer 56 may be a single layer or a multilayer. The first interlayer dielectric layer 56 may include an etch stop layer used when the interconnection structures 52 to 54 are formed. As an example, the first interlayer dielectric layer 56 may have a structure in which an oxide layer and an etch stop layer are alternately stacked.

The interconnection structure 52 electrically connected to the first contact plug 50 may be formed. The interconnection structure 53 electrically connected to the second contact plug 51 may be formed. The interconnection structure 54 connected to the channel structures CH may be formed. The interconnection structures 52 to 54 may each include a contact plug, a wiring line, and the like. As an example, the interconnection structure 54 may include bit lines connected to the channel structures CH.

Subsequently, first bonding pads 55 connected to the interconnection structures 52 to 54 may be formed. Through this, a first wafer WF1 including a cell array CA may be formed.

Figure 5D:
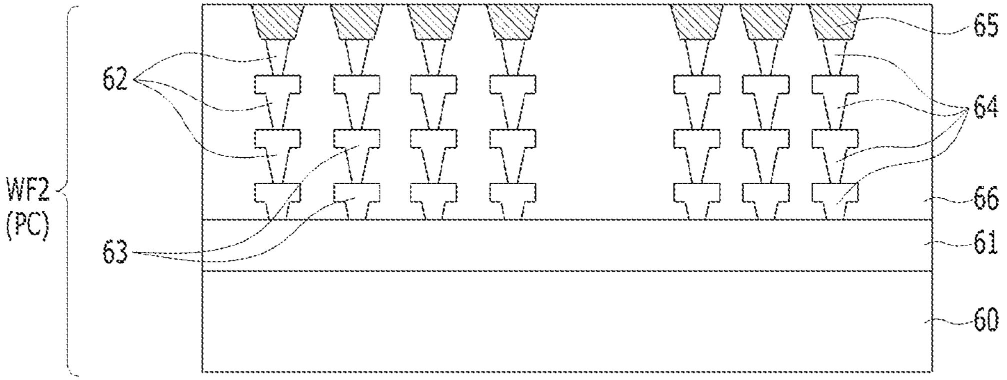

Referring to FIG. 5D, a peripheral circuit 61 may be formed on a substrate 60. The peripheral circuit 61 may include a page buffer, a row-decoder, a complementary metal-oxide semiconductor (CMOS) circuit, and the like.

Subsequently, interconnection structures 62 to 64 and a second interlayer dielectric layer 66 may be formed. The interconnection structures 62 to 64 may be located in the second interlayer dielectric layer 66, and the second interlayer dielectric layer 66 may be a single layer or a multilayer. The second interlayer dielectric layer 66 may include an etch stop layer used when the interconnection structures 62 to 64 are formed. As an example, the second interlayer dielectric layer 66 may have a structure in which an oxide layer and an etch stop layer are alternately stacked. The interconnection structures 62 to 64 may be electrically connected to the peripheral circuit 61. Subsequently, second bonding pads 65 connected to the interconnection structures 62 to 64 may be formed. Through this, a second wafer WF2 including the peripheral circuit 61 may be formed.

Figure 5E:
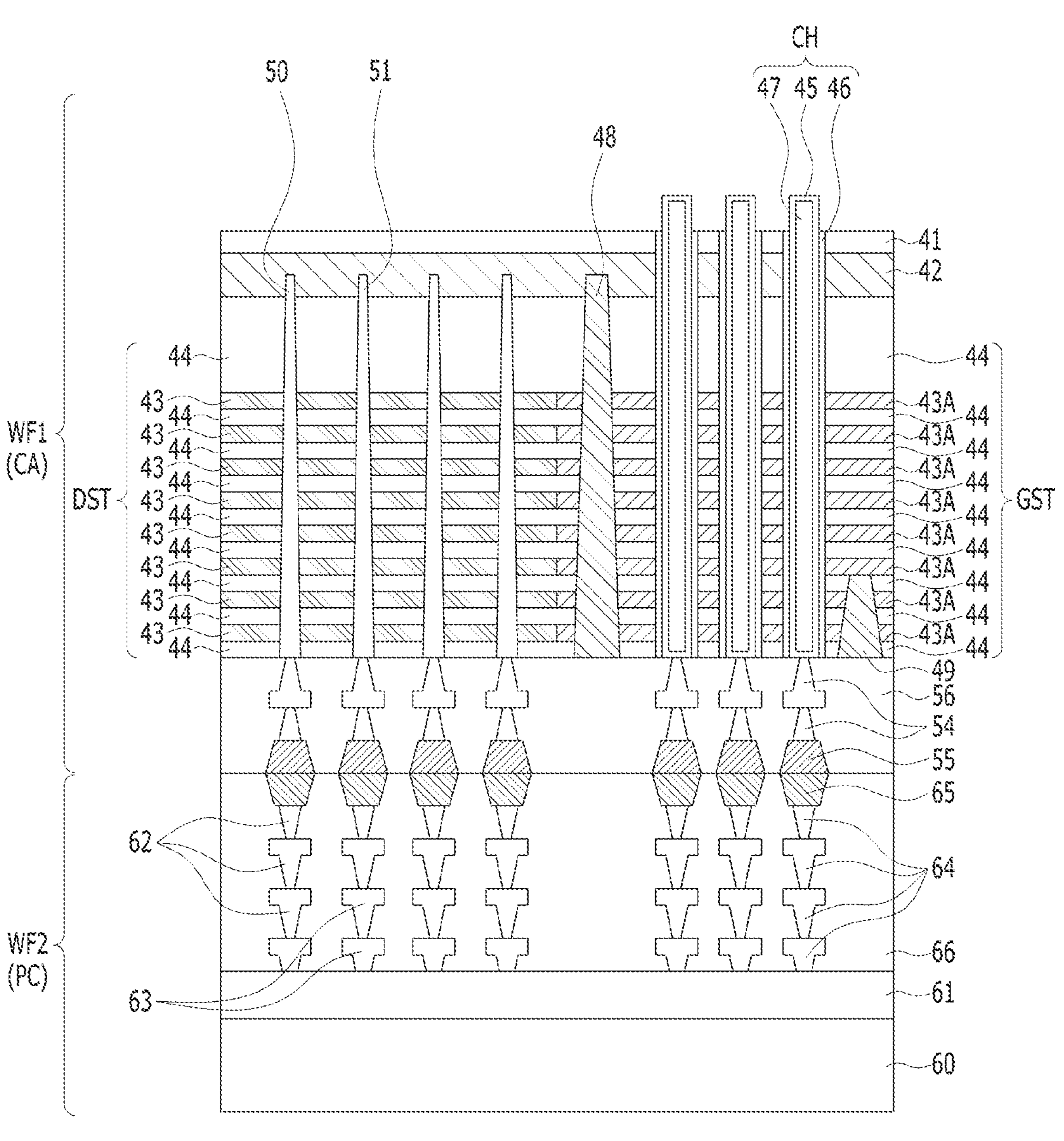

Referring to FIG. 5E, the first wafer WF1 and the second wafer WF2 may be bonded to each other. The first bonding pad 55 and the second bonding pad 65 may be bonded to each other at a bonding interface IF. The first wafer WF1 may be reversed and bonded so that the first wafer WF1 is located above the second wafer WF2. Through this, the first wafer WF1 including the substrate 40, the source select layer 42, and the gate structure GST and the second wafer WF2 including the peripheral circuit 61 may be electrically connected to each other.

Subsequently, the substrate 40 may be at least partially removed. In consideration of subsequent processes, structural stability, and the like, only a part of the substrate 40 or the entire substrate 40 may be removed. As an example, after a rear surface of the substrate 40 is planarized or ground, the substrate 40 may be removed by performing a wet etching process. The planarization process may be performed using a chemical mechanical polish (CMP) method. Through this, the insulating layer 41 may be exposed. Furthermore, the channel structure CH may protrude from the insulating layer 41.

Subsequently, the channel layer 45 may be exposed by etching the memory layer 46. As an example, the memory layer 46 may be removed by a dry cleaning process. Subsequently, the channel layer 45 may be doped with impurities. As an example, impurities may be implanted into the channel layer 45 by using an ion implantation process. Through this, a threshold voltage of a source select transistor may be adjusted.

Figure 5F:
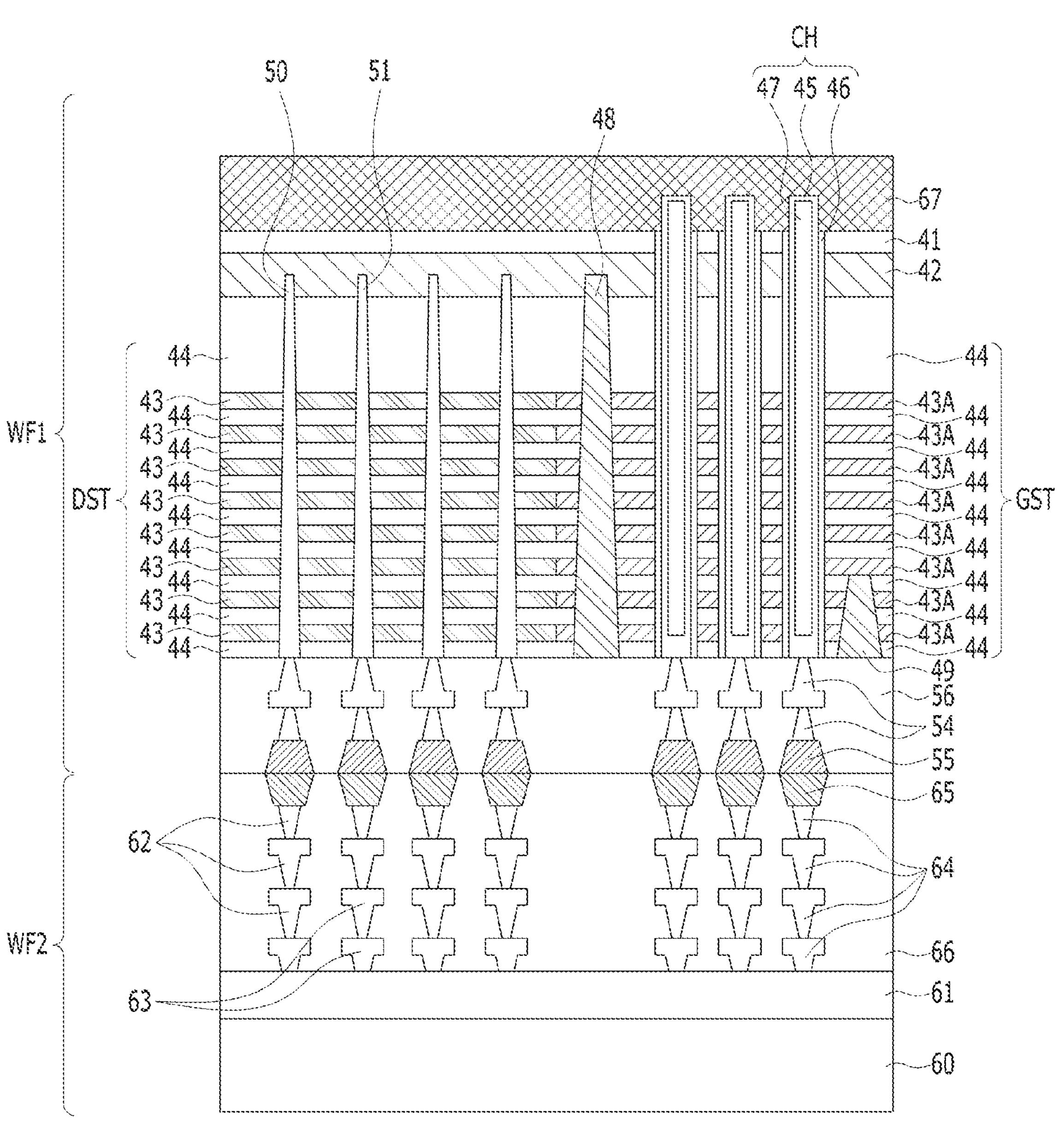

Referring to FIG. 5F, a source layer 67 may be formed. The source layer 67 may be formed by depositing a conductive material such as polysilicon or metal. As an example, after a polysilicon layer is deposited, a heat treatment process using a laser or the like may be performed to activate the polysilicon layer. The source layer 67 may be directly connected to the channel layer 45.

Figure 5G:
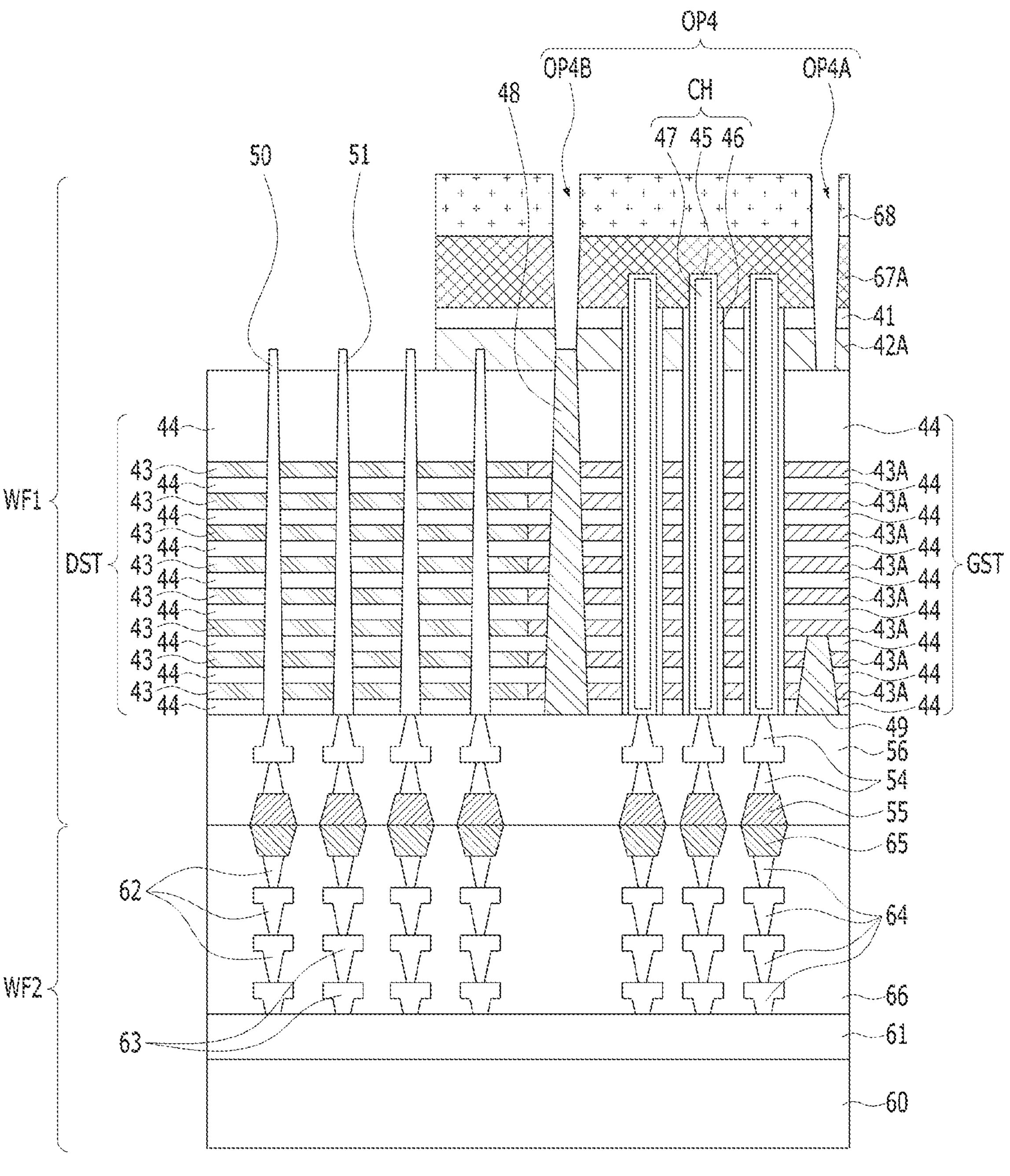
Figure 5H:
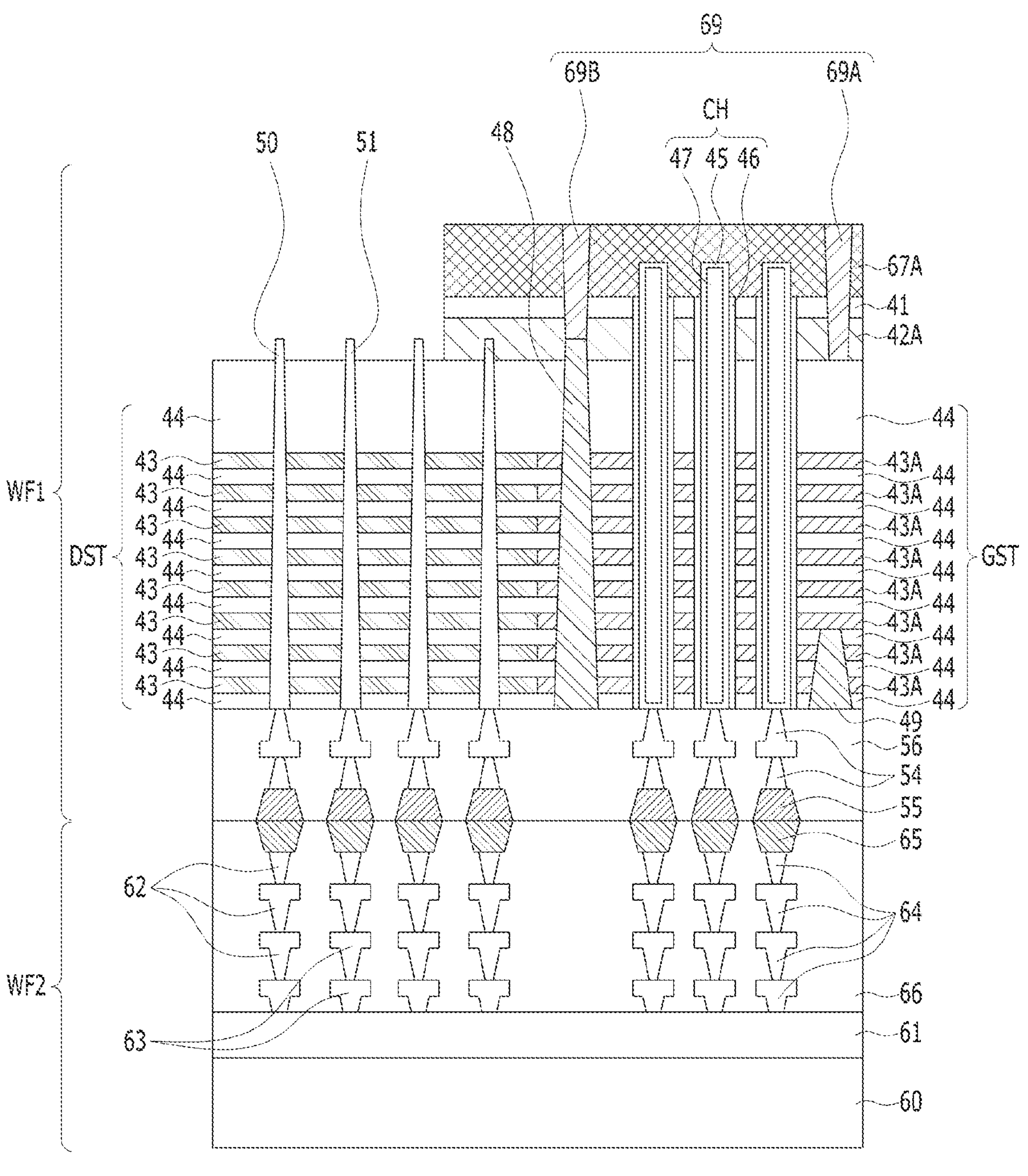

Referring to FIGS. 5G and 5H, source patterns 67A and source select lines 42A may be formed. The source select lines 42A may be located below the source patterns 67A, respectively. Through this, the source patterns 67A and the source select lines 42A may be separated in units of memory block or in units of sub-memory block.

First, referring to FIG. 5G, a mask pattern 68 may be formed on the source layer 67. Subsequently, the source patterns 67A may be formed by etching the source layer 67 using the mask pattern 68 as an etching barrier. Subsequently, the source select lines 42A may be formed by etching the source select layer 42 using the mask pattern 68 and/or the source patterns 67A as an etching barrier. Fourth openings OP4 may be formed between the source patterns 67A and between the source select lines 42A. The fourth openings OP4 may be formed at the boundary between the memory blocks or within the memory block.

The fourth openings OP4 may have different depths, different shapes, and the like depending on positions. A fourth opening OP4A may be located in correspondence with the second isolation structure 49. The fourth opening OP4A and the second isolation structure 49 may be located to face each other with the word lines interposed therebetween. The fourth opening OP4A may be located at the boundary between the memory blocks or within the memory block. The fourth opening OP4A may have a depth by which the second material layer 44 is exposed. The source patterns 67A on both sides may be separated from each other and the source select lines 42A may be separated from each other by the fourth opening OP4A.

A fourth opening OP4B may be located in correspondence with the slit structure 48. The fourth opening OP4B may be located at the boundary between the memory blocks. The fourth opening OP4B may have a depth by which the slit structure 48 is exposed. As an example, a bottom surface of the fourth opening OP4B may be located between an upper surface and a lower surface of the source select line 42A or may be located in the gate structure GST.

When the fourth openings OP4 are formed, a portion of the source layer 67 and the source select layer 42 formed in the contact region CTR may be at least partially removed. Through this, the dummy structure DST may be at least partially exposed, and at least one of the first contact plugs 50 and the second contact plugs 51 may be exposed.

Referring to FIG. 5H, first isolation structures 69 may be formed in the fourth openings OP4, respectively. The first isolation structures 69 may extend between the source patterns 67A and between the source select lines 42A. The first isolation structures 69 may include an insulating material such as oxide, nitride, or air gap. The first isolation structures 69A may be located in correspondence with the second isolation structure 49. The first isolation structure 69B may be located in correspondence with the slit structure 48.

Figure 5I:
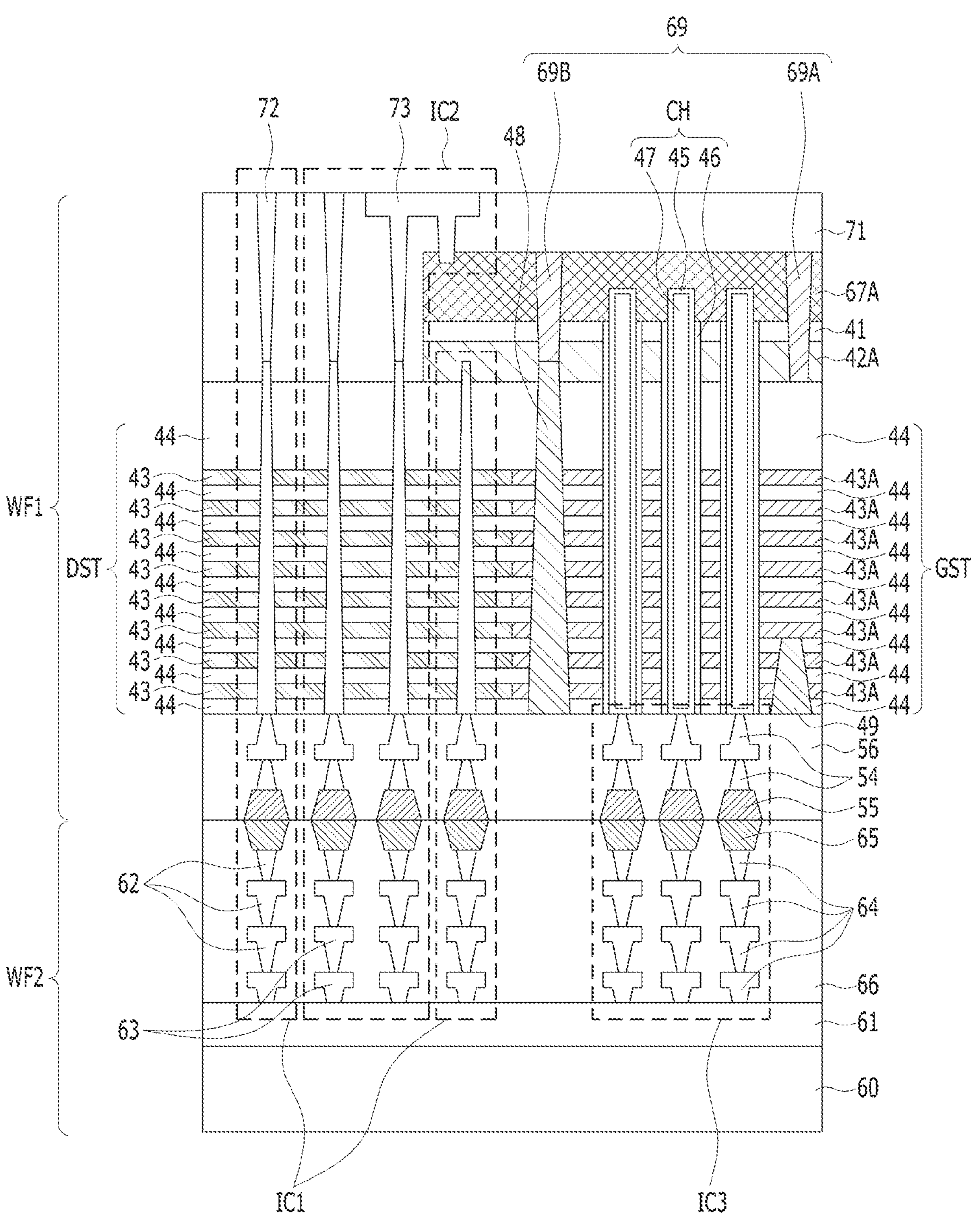

Referring to FIG. 5I, interconnection structures 72 and 73 and an interlayer dielectric layer 71 may be formed. The interconnection structures 72 and 73 may be located in the interlayer dielectric layer 71, and the interlayer dielectric layer 71 may be a single layer or a multilayer. The interconnection structure 72 may be electrically connected to the first contact plug 50, and the interconnection structure 73 may be electrically connected to the second contact plug 51.

Through this, a first interconnection structure IC1 of electrically connecting the source select lines 42A and the peripheral circuit 61 to each other may be formed. A bias may be individually applied to the source select lines 42A through the first interconnection structure IC1, and the source select lines 42A may be individually driven. A second interconnection structure IC2 of electrically connecting the source patterns 67A and the peripheral circuit 61 to each other may be formed. A bias may be individually applied to the source patterns 67A through the second interconnection structure IC2, and the source patterns 67A may be individually driven.

According to the manufacturing method described above, after the first wafer WF1 and the second wafer WF2 are bonded to each other, the source layer 67 and the source select layer 42 may be patterned together. Accordingly, compared to a case where the source layer 67 and the source select layer 42 are patterned in separate processes, the number of mask patterns used in a manufacturing process can be reduced and the manufacturing cost can be reduced. Since the first wafer WF1 and the second wafer WF2 are bonded to each other, an interconnection structure can be simplified. Furthermore, the source layer 67 and the source select layer 42 may be separated in units of memory block or in units of sub-memory block. Accordingly, operating characteristics of the source select lines 42A can be improved, and disturbance of a program operation or a read operation can be improved.

Figure 6A:
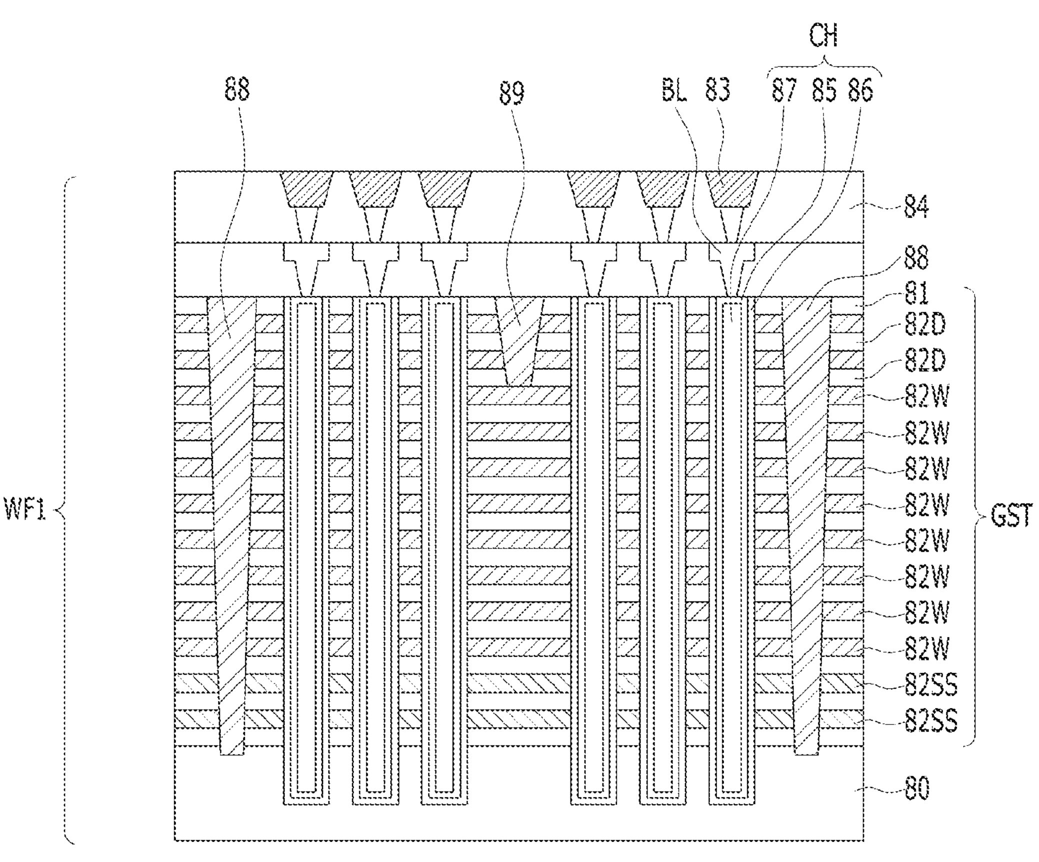
FIGS. 6A to 6C are diagrams for describing a manufacturing method of a semiconductor device in accordance with an embodiment.
Figure 6B:
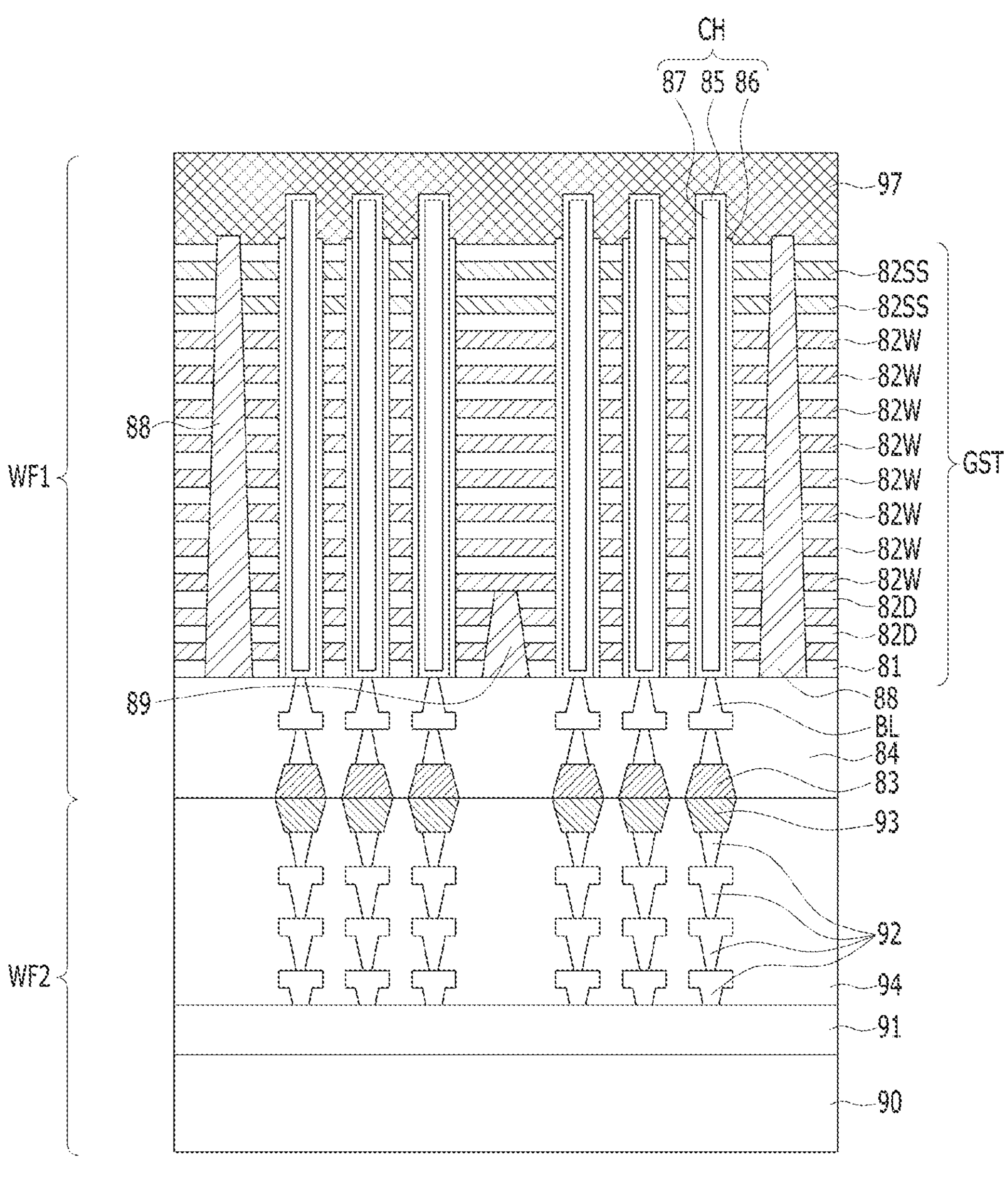
Figure 6C:
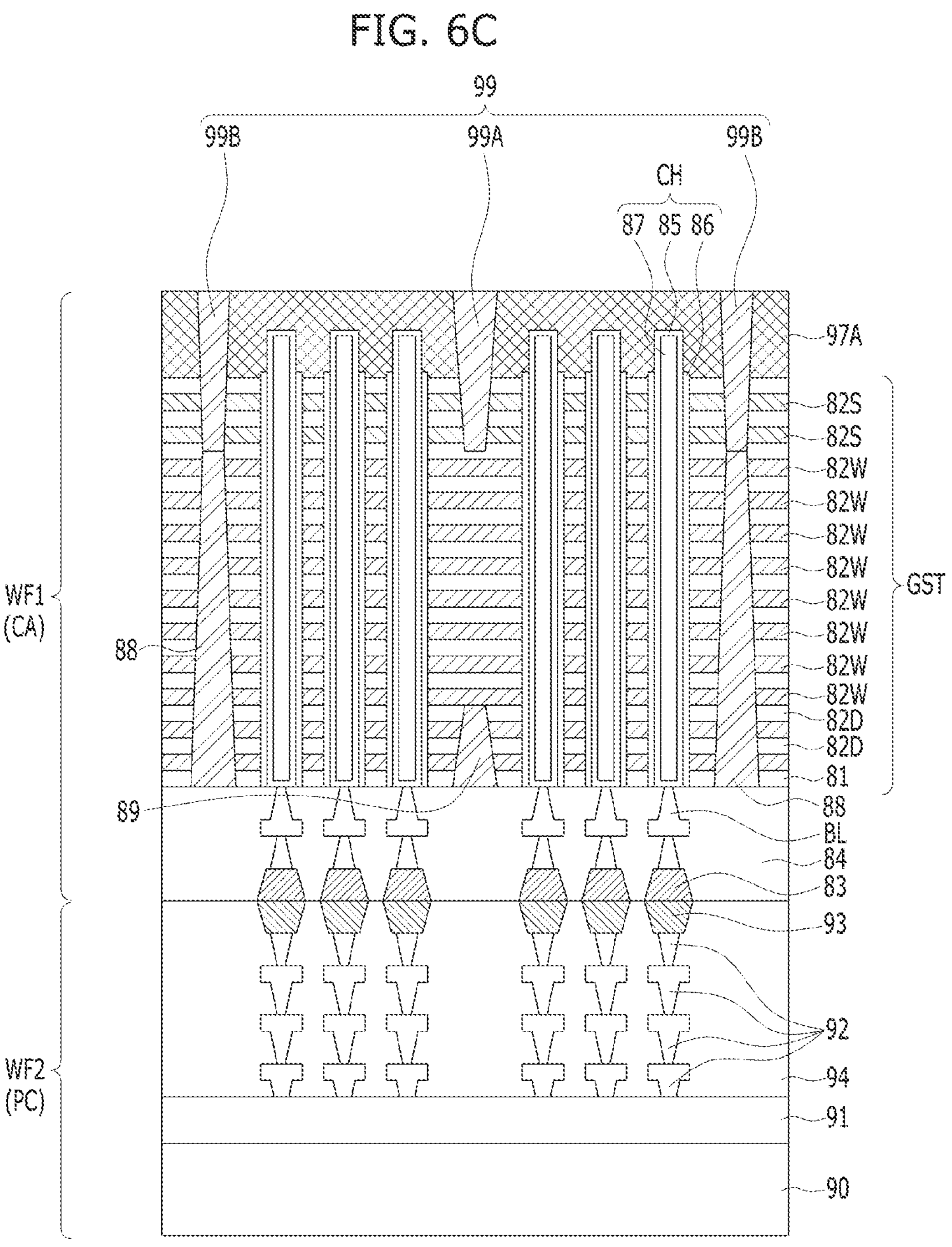

FIGS. 6A to 6C are diagrams for describing a manufacturing method of a semiconductor device in accordance with an embodiment. Hereinafter, descriptions may be made without repeating content already described above.

Referring to FIG. 6A, a first wafer WF1 may be formed. The first wafer WF1 may include a substrate 80, a source select layer 82SS, word lines 82W, drain select lines 82D, and channel structures CH. The first wafer WF1 may further include a slit structure 88, a second isolation structure 89, a first interlayer dielectric layer 84, bit lines BL, or first bonding pads 83, or a combination thereof.

First, a gate structure GST may be formed on the substrate 80. The gate structure GST may include source select layers 82SS, drain select lines 82D, and word lines 82W. As an example, the gate structure GST may include gate lines and insulating layers 81 that are alternately stacked. Among the gate lines, at least one uppermost gate line may be a drain select line 82D, at least one lowermost gate line may be the source select layer 82SS, and the other gate lines may be the word lines 82W.

The channel structures CH may be located in the gate structure GST. The channel structures CH may extend into the substrate 80 through the drain select lines 82D, the word lines 82W, and the source select layer 82SS. The channel structures CH may each include a channel layer 85, a memory layer 86, and an insulating core 87, or a combination thereof.

A slit structure 88 may be located in the gate structure GST. The gate structure GST may be separated in units of memory blocks by the slit structure 88. A second isolation structure 89 may be located in the gate structure GST. The drain select lines 82D may be separated in units of memory blocks or in units of sub-memory blocks by the second isolation structure 89.

Subsequently, an interconnection structure including bit lines BL, the first interlayer dielectric layer 84, and the first bonding pads 83 may be formed.

Referring to FIG. 6B, a second wafer WF2 including a peripheral circuit 91 may be formed. The second wafer WF2 may include a substrate 90, the peripheral circuit 91, an interconnection structure 92, a second interlayer dielectric layer 94, and a second bonding pad 93, or a combination thereof.

Subsequently, the first wafer WF1 and the second wafer WF2 may be bonded to each other, and the substrate 80 may be at least partially removed. Through this, the gate structure GST may be exposed. The channel structure CH may protrude from a surface of the gate structure GST. The slit structures 88 may protrude from the surface of the gate structure GST. Alternatively, in the process of removing the substrate 40, the slit structures 88 may be etched and may be exposed by the surface of the gate structure GST. Subsequently, the memory layer 86 may be etched to expose the channel layer 85. Subsequently, a source layer 97 may be formed on the gate structure GST. The source layer 97 may be connected to the channel structures CH exposed by removing the substrate 80.

Referring to FIG. 6C, source patterns 97A may be formed by etching the source layer 97. The source select layer 82SS may be etched to form source select lines 82S. Subsequently, first isolation structures 99 extending between the source patterns 97A and between the source select lines 82S may be formed. A first isolation structure 99A may be located in correspondence with the second isolation structure 89. A first isolation structure 99B may be located in correspondence with the slit structure 88.

According to the manufacturing method described above, the gate structure GST may be formed to include the source select lines 82S. After the first wafer WF1 and the second wafer WF2 are bonded to each other, the source patterns 97A and the source select lines 82S may be formed in units of memory blocks or in units of sub-memory blocks. Accordingly, operating characteristics of the source select lines 82S can be improved, and disturbance of a program operation or a read operation can be improved.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:
- a gate structure including drain select lines and word lines;
- source patterns;
- source select lines located between the gate structure and the source patterns;
- a first isolation structure extending between the source patterns and between the source select lines;
- a second isolation structure extending between the drain select lines; and
- channel structures extending into the source patterns through the gate structure and the source select lines,
- wherein the word lines are disposed between the first isolation structure and the second isolation structure.

2. The semiconductor device of claim 1, wherein the source select lines are located below the source patterns, respectively.

3. The semiconductor device of claim 1, wherein the source patterns include first sidewalls and the source select lines include second sidewalls aligned with the first sidewalls.

4. The semiconductor device of claim 3, further comprising:
- insulating layers located between the source patterns and the source select lines and including third sidewalls aligned with the first sidewalls and the second sidewalls.

5. The semiconductor device of claim 1, wherein the second isolation structure is located in correspondence with the first isolation structure.

6. The semiconductor device of claim 5, wherein the first isolation structure and the second isolation structure are located within a memory block.

7. The semiconductor device of claim 1, further comprising:
- a peripheral circuit;
- a dummy structure located on the peripheral circuit; and
- a first interconnection structure extending through the dummy structure and electrically connecting the peripheral circuit and the source select lines to each other.

8. The semiconductor device of claim 7, further comprising:
- a second interconnection structure extending through the dummy structure and electrically connecting the peripheral circuit and the source patterns to each other.

9. The semiconductor device of claim 7, further comprising:

a third interconnection structure including bit lines connected to the channel structures and connecting the bit lines and the peripheral circuit.

10. The semiconductor device of claim 1, wherein the first isolation structure and the second isolation structure have tapered shapes that taper in opposite directions from one another.

11. A semiconductor device comprising:

a gate structure including drain select lines and word lines;

source patterns;

source select lines located between the gate structure and the source patterns;

a first isolation structure extending between the source patterns and between the source select lines;

a second isolation structure extending between the drain select lines;

channel structures extending into the source patterns through the gate structure and the source select lines; and a slit structure extending through the gate structure and connected to the first isolation structure.

12. The semiconductor device of claim 11, wherein the slit structure is located at a boundary between memory blocks.

13. The semiconductor device of claim 11, wherein the slit structure extends into the source select line.

14. The semiconductor device of claim 11, wherein the first isolation structure and the slit structure have tapered shapes that taper in opposite directions from one another.

15. A semiconductor device comprising:

drain select lines;

word lines stacked over the drain select lines;

source patterns disposed over the word lines and including first sidewalls;

source select lines located between the word lines and the source patterns and including second sidewalls aligned with the first sidewalls;

a first isolation structure extending between the source patterns and between the source select lines, wherein the first isolation structure is disposed over the word lines; and channel structures extending into the source patterns through the drain select lines, the word lines, and the source select lines.

16. The semiconductor device of claim 15, wherein the first isolation structure is located at a boundary between memory blocks or within the memory block.

17. The semiconductor device of claim 15, further comprising:

a second isolation structure extending between the drain select lines and located at a boundary between memory blocks or within the memory block.

18. The semiconductor device of claim 15, further comprising:

a slit structure extending through the drain select lines, the word lines, and the source select lines and located at a boundary between memory blocks.

19. The semiconductor device of claim 15, wherein the source select lines have substantially the same width as the source patterns.

20. The semiconductor device of claim 15, further comprising:

a second isolation structure extending between the drain select lines, wherein the first isolation structure and the second isolation structure have tapered shapes that taper in opposite directions from one another.

* * * * *